United States Patent [19]
Yanagida

[11] Patent Number: 5,376,228
[45] Date of Patent: Dec. 27, 1994

[54] DRY ETCHING METHOD

[75] Inventor: Toshiharu Yanagida, Kanagawa, Japan

[73] Assignee: Sony Corporation, Tokyo, Japan

[21] Appl. No.: 81,105

[22] Filed: Jun. 25, 1993

[30] Foreign Application Priority Data

Jun. 29, 1992 [JP] Japan ................................. 4-170978

[51] Int. Cl.$^5$ ........................................... H01L 21/00
[52] U.S. Cl. ................... 156/651; 156/643; 156/646; 156/662; 156/653; 156/657
[58] Field of Search ............... 156/643, 646, 662, 657, 156/656, 651, 652, 653

[56] References Cited

FOREIGN PATENT DOCUMENTS 53-146939 12/1978 Japan .
3-276626 12/1991 Japan .
4-170026 6/1992 Japan .
4-258117 9/1992 Japan .

Primary Examiner—R. Bruce Breneman
Assistant Examiner—George Goudreau
Attorney, Agent, or Firm—Hill, Steadman & Simpson

[57] ABSTRACT

A dry etching method wherein an etching gas containing carbonyl sulfide or COS is used. If carbonyl and C—O bonds derived from COS are introduced into a decomposition product of a resist mask 4, film quality of carbonaceous polymer becomes rigid, thereby exhibiting, despite a small amount of deposition, improvements in selectivity to the resist and selectivity to Si. CO* released from COS extracts O atoms in an $SiO_2$ interlayer insulation film 3, and contributes to high etchrate. Sulfur or S contributes to surface protection along with carbonaceous polymer. If $CH_xF_{4-x}$, $C_mF_n$, $S_2F_2$ and the like are used jointly with COS, further improvements can be achieved in high etchrate, high selectivity and low pollution.

20 Claims, 1 Drawing Sheet

DRY ETCHING METHOD

BACKGROUND OF THE INVENTION

(1) Field of the Invention

The present invention relates to a dry etching method applied in the manufacturing field of semiconductor devices, and particularly to a dry etching method for etching a silicon compound layer whereby high selectivity, high etchrate, low damage and low pollution can be achieved in minute contact hole processing.

(2) Description of the Related Art

As large-scale integration and high performance of semiconductor devices as seen in recent VLSI have proceeded, higher processing precision is required for dry etching of a silicon compound layer represented by silicon oxide ($SiO_2$).

First, the enlargement of the area of the device chip due to large-scale integration has increased the size of the wafer. Uniform processing within the wafer surface due to high minuteness of the pattern to be formed is required. Also, multiple-kind small-quantity production as represented by ASIC is required. On the basis of these backgrounds, the main stream of dry etching has been shifting from the traditional batch processing toward the single wafer processing. In this case, for maintaining productivity equal to that achieved in the past, the etchrate per wafer must be improved significantly.

In addition, with a shallow junction of an impurity diffused region for attaining high etchrate and minuteness of the device, and thin material layers of various types, an etching technique whereby higher selectivity to the underlying layer and lower damage than in the past is required. For instance, an $SiO_2$ interlayer insulation film is etched with a silicon substrate or a polysilicon layer as an underlying layer, when a contact is to be formed in an impurity diffused region formed within a semiconductor substrate or in source-drain regions of a PMOS transistor employed as a resistive load element of SRAM.

Etching of an $SiO_2$ based material layer has been carried out conventionally in a mode of increased ionicity for cutting a rigid Si—O bond. Typical etching gases are $CHF_3$, $CF_4$ and the like, and incident ion energy of $CF_x^+$ released therefrom is used. However, for carrying out high-rate etching, it is necessary to increase the incident ion energy, and the etching reaction becomes close to a physical sputtering reaction. Therefore, high etchrate and selectivity have always been incompatible with each other.

Conventionally, $H_2$ or a depositional hydrocarbonaceous gas is added to the etching gas, so as to increase an apparent ratio of the number of carbon atoms to the number of fluorine atoms or C/F ratio. Thus, deposition of carbonaceous polymer generated competitively with the etching reaction is accelerated, thereby achieving high selectivity.

Instead of these conventional etching gases, the present applicant previously proposed a dry etching method for etching a silicon compound layer using a saturated or unsaturated high-order chain fluorocarbonaceous gas having two or more carbons, in the Japanese Patent KOKAI Publication Serial No. 3-276626. The proposed dry etching method is aimed at attaining high etchrate by using a fluorocarbonaceous gas such as $C_2F_6$, $C_3F_8$, $C_4F_{10}$, $C_4F_8$ and the like, thus efficiently forming a large quantity of $CF_x^+$ from one molecule. However, the single use of the high-order chain fluorocarbonaceous gas increases the amount of F* formed, and the selection ratios to the resist and to the underlying layer cannot be set sufficiently large. For instance, in case of etching an $SiO_2$ layer on a silicon substrate using $C_3F_8$ as an etching gas, though high etchrate is achieved, problems remain such as low selectivity to the resist of about 1.3, shortage of etching durability and generation of dimensional losses due to retreat of the pattern edge. Since selectivity to silicon is about 4.2, a problem remains also in overetching durability.

Thus, in order to solve these problems, two-stage etching is carried out in the above-mentioned prior art, wherein etching with a single use of a high-order chain fluorocarbonaceous gas is suspended shortly before exposure of the underlying layer, and wherein, in etching a remaining portion of a silicon compound layer, a hydrocarbonaceous gas such as ethylene ($C_2H_4$) is added to the compound so as to accelerate deposition of carbonaceous polymer. The object of this technique is to supply C atoms in the etching reaction system and to increase the apparent C/F ratio by consuming excessive F* with H* formed in a plasma for forming HF.

However, under the status quo wherein design rules of the semiconductor device is highly minute, dimensional losses from the etching mask is hardly allowable. Even though two-stage etching as mentioned above is carried out, it is necessary to further improve selectivity in the etching of the first stage. Also, as further minuteness proceeds, effects of particle pollution due to carbonaceous polymer may become serious. Therefore, it is preferable to minimize the amount of a depositional gas such as a hydrocarbonaceous gas in the etching of the second stage.

In view of the above-mentioned status of the art, the present inventor proposed a technique wherein a silicon compound layer is etched, with the temperature of a substrate to be etched being controlled to not higher than 50° C., using a chain unsaturated fluorocarbon compound having at least one unsaturated bond within a molecule, in the specification of the Japanese Patent Application No. 2-295225. The chain unsaturated fluorocarbon compound is, for example, octafluorobutene ($C_4F_8$), hexafluoropropene ($C_3F_6$) and the like. Theoretically, since these gases form two or more $CF_x^+$ from one molecule on dissociation due to electric discharges, high-rate etching of $SiO_2$ becomes possible. Also, with the unsaturated bond within the molecule, highly active radicals tend to be generated by dissociation, and polymerization of carbonaceous polymer can be accelerated. Furthermore, since the temperature of the substrate to be etched is controlled to not higher than 50° C., the deposition of the carbonaceous polymer can be accelerated.

With this technique, selectivity to the resist and to the silicon underlying layer was improved significantly without using the depositional gas, and the particle pollution was reduced.

Further, the present inventor previously proposed a technique wherein an etching gas containing a saturated or unsaturated fluorocarbon compound having a cyclic portion at least in part of a molecule structure is used, in the specification of the Japanese Patent Application No. 3-40966. The cyclic fluorocarbon compound has at least three carbons, and has a higher C/F ratio than a chain fluorocarbon compound with the same number of carbons. Therefore, high-rate etching due to a large quantity of $CF_x^+$ and highly selective etching due to efficient formation of polymer become possible.

In this manner, the above-mentioned chain unsaturated fluorocarbon compound or the cyclic fluorocarbon compound made it possible to carry out highly selective etching of a silicon compound layer using an etching gas of single composition.

However, in order to provide a process which can be adapted to production of a future ULSI device, it is necessary to further improve selectivity to the resist for the following reason. That is, in such a large-scale integration device, long-time overetching is indispensable due to an increase of surface steps of the silicon compound layer to be etched. At this time, dimensional losses are generated unless the resist is prevented from retreating.

As another problem, it is necessary to further reduce the particle pollution. The technique using the chain unsaturated fluorocarbon compound, the cyclic fluorocarbon compound and the like has no difference from the conventional technique in that the mechanism for securing selective ratios is attained by deposition of carbonaceous polymer which proceeds competitively with the etching reaction. Therefore, if the number of wafer processings is increased, carbonaceous polymer is stored in the etching chamber, thereby deteriorating the particle level. Accordingly, under the status quo wherein the particle pollution is reduced, there is only limited improvements such as a reduction in the frequency of maintenance for cleaning the etching chamber.

OBJECT OF THE INVENTION

Thus, it is an object of the present invention to provide a dry etching method for etching a silicon compound layer whereby it is possible to attain higher selectivity and lower pollution than in the past and to exhibit high etchrate and low damage.

SUMMARY OF THE INVENTION

According to the present invention, there is provided a dry etching method comprising etching a silicon based compound layer, using an etching gas containing carbonyl sulfide.

According to the present invention, there is also provided a dry etching method wherein an etching gas containing carbonyl sulfide and a fluorocarbonaceous compound expressed by a general formula $CH_xF_{4-x}$ with x being integers from 0 to 3 is used.

According to the present invention, there is also provided a dry etching method wherein the etching is divided into two stages of a just etching process and an overetching process, with the composition of the etching gas being changed for increasing the content ratio of the carbonyl sulfide to the fluorocarbonaceous compound in the overetching process.

According to the present invention, there is also provided a dry etching method comprising etching a silicon compound layer, using an etching gas containing carbonyl sulfide and high-order fluorocarbon expressed by a general formula $C_mF_n$, where m, n are natural numbers, satisfying $m \geq 2$, $n \leq 2m+2$.

According to the present invention, there is also provided a dry etching method wherein the etching is divided into two stages of a just etching process and an overetching process, with the composition of the etching gas being changed for increasing the content ratio of the carbonyl sulfide to the high-order fluorocarbon in the overetching process.

According to the present invention, there is also provided a dry etching method wherein any one of the etching gas containing carbonyl sulfide, the etching gas containing carbonyl sulfide and the fluorocarbonaceous compound, and the etching gas containing carbonyl sulfide and the high-order fluorocarbon, further contains at least one kind of sulfur fluoride selected from the group consisting of $S_2F_2$, $SF_2$, $SF_4$ and $S_2F_{10}$, supplying depositable S to an etching reaction system.

According to the present invention, there is further provided a dry etching method wherein an etching gas containing carbonyl sulfide and at least one selected from the group consisting of the fluorocarbonaceous compound and the high-order fluorocarbon is used in the just etching process, and wherein an etching gas containing carbonyl sulfide and the sulfur fluoride is used in the overetching process.

The fluorocarbonaceous compound is one of three kinds of fluorohydrocarbon of $CHF_3$, $CH_2F_2$ and $CH_3F$, or $CF_4$ (tetrafluoromethane) as is clear from its general formula $CH_xF_{4-x}$, where x expresses integers from 0 to 3. $CH_4(x=4)$ is excluded, since it cannot form $F^*$ or $CF^*$, that is, etchants of $SiO_2$, and causes excessive deposition of carbonaceous polymer.

The high-order fluorocarbon may be of all kinds having carbon skeleton structure, as is clear from its general formula $C_mF_n$, where m and n are natural numbers, satisfying $m \geq 2$ and $n \leq 2m+2$. That is, the carbon skeleton may be of low order or high order, straight chain or branching, and saturated or unsaturated. For instance, in case of $n = 2m+2$, the high-order fluorocarbon corresponds to parfluoroalkane in a straight chain or branching state. In case of $n < 2m+2$, chain unsaturation is structurally possible. Particularly in case of $m \geq 3$, cyclic saturation and cyclic unsaturation are possible.

An upper limit of the number of carbons m is not particularly set, and can be suitably selected within a range for easy introduction in a natural or gasified state into the etching reaction system, For improving surface protection effects of the wafer while attaining low pollution, the present inventor considered the following two points: (a) to reinforce film quality of carbonaceous polymer itself so as to exhibit sufficiently high wafer surface protection effects despite a reduced deposit amount of carbonaceous polymer; and (b) not to depend solely on carbonaceous polymer for surface protection, but to substitute other substances which are unlikely to be sources of pollution for a part of the carbonaceous polymer.

In view of this, carbonyl sulfide (COS) has been selected as a main component of the etching gas. COS has a linear molecular structure of O=C=S. Carbonyl in such a molecule has high polymerization accelerating activity, raising the polymerization degree of carbonaceous polymer, and thus increases durability to ion incidence and attacks of radicals, Also, it has been clear from recent studies that if carbonyl is introduced into carbonaceous polymer, higher chemical and physical stability than in conventional carbonaceous polymer constituted by a simply repetitive structure of $-CX_2-$, where X expresses a halogen atom, may be obtained. This can be intuitively understood from the fact that, in comparing bond energies between two atoms, a C—O bond (1077 kJ/mol) is far larger than a C—C bond (607 kj/mol). Further, an increase of polarity of carbonaceous polymer due to introduction of carbonyl and an increase of electrostatic adsorption force to the wafer negatively electrified during etching improve surface protection effects of carbonaceous polymer.

COS can release sulfur (S) on dissociation due to electric discharges. If the temperature of a wafer is controlled to not higher than room temperature, S is deposited on the its surface, though depending also on other conditions. However, on a material layer which releases O atoms by sputtering, such as an $SiO_x$ based material layer, S is removed in the form of $SO_x$ and therefore there is not deposited. Thus, S contributed mainly to sidewall protection, surface protection of an exposer silicon based underlying layer and surface protection of a resist mask. When the resist mask is removed by conventional $O_2$ plasma ashing after the etching, S is simultaneously removed by combustion. Otherwise, only if the wafer is heated to about 90° C. or higher, S can be removed by sublimation. In any case, there is no fear that S may be a source of particle pollution.

In this manner, the film quality of carbonaceous polymer itself is reinforced, and deposition of S is expected. For these reasons, with the present invention, the incident ion energy necessary for anisotropic processing can be reduced, and selectivity to the resist can be improved. These effects are very advantageous in a process in which significant overetching is required, and in a process in which a thin resist film is required for attaining high resolution in photolithography. Also, since the deposit amount of carbonaceous polymer necessary for attaining high anisotropy and high selectivity can be reduced, particle pollution can be reduced compared with the prior art.

Since the reduction of the incident ion energy naturally leads to improvements in underlying selectivity, for example, generation of damages to a shallow junction formed in a substrate can be prevented.

Another effect of COS is contribution to high etchrate. COS can release CO* on dissociation due to electric discharges. The radical has a strong reducing action, and can extract O atoms in $SiO_2$. This can be understood from the fact that the interatomic bond energy of a C—O bond is far larger than the Si—O bond (465 kJ/mol). The Si atoms after extraction of O atoms, if having halogen atoms suitably for the etching reaction system, are combined with the halogen atoms and are removed in the form of a halogen compound.

The present invention is based on the foregoing ideas. However, other methods for attaining higher etchrate, lower pollution and low damage by using additional gases and changing the etching gas composition between the just etching and overetching processes are proposed.

First, a fluorocarbonaceous compound used as an additional gas and expressed by a general formula $CH_xF_{4-x}$ ($0 \leq x \leq 3$) is aimed at supplying F* and $CF_x^+$ to an etching reaction system. F* is useful for releasing Si atoms formed by extraction of O atoms from CO*, in the form of $SiF_x$. A typical chemical reaction formula is shown as follows:

$$2CO^* + 4F^* + SiO_2 \rightarrow 2CO_2 \uparrow + SiF_4 \uparrow$$

$CF_x^+$ assists the radical reaction by its kinetic energy, thereby contributing to high etchrate.

Further, since decomposition products in a plasma of $CH_xF_{4-x}$ become materials for carbonaceous polymer, it is not necessary to supply materials for carbonaceous polymer by sputtering the resist mask with ions having high incident energy. Thus, selectivity to the resist can be improved.

Meanwhile, high-order fluorocarbon as another additional gas expressed by a general formula $C_mF_n$, where $m \geq 2$, $n \leq 2m+2$, theoretically forms a larger quantity of $CF_x^+$ from one molecule than $CH_xF_{4-x}$, thereby achieving higher etch rate. Further, if the carbon skeleton has an unsaturated bond or a cyclic structure therein, C/F ratio is increased and efficiency in forming carbonaceous polymer is raised.

When these additional gases are used, if the etching process is divided into two stages with an increased content ratio of COS to the additional gases in the overetching process, etching in the vicinity of boundary surface with the underlying Si based material layer proceeds by a mechanism consisting mainly of extraction of O atoms due to CO*, and the contribution of S in surface protection is relatively increased. Along with these effects, contents ratios of $Ch_xF_{4-x}$ and $C_mF_n$ are naturally lowered thus reducing F* in the etching reaction system. For these reasons, the selection ratio to the underlying Si based material layer can be improved, and damages can be diminished.

In the present, invention, sulfur fluoride is proposed as another additional gas. The four kinds of sulfur fluoride used here, that is $S_2F_2$, $SF_2$, $SF_4$ and $S_2F_{10}$, are compounds previously proposed by the present, applicant for etching an $SiO_2$ based material layer, in the Japanese Patent KOKAI Publication Serial No. 4-84427. Etchants released from sulfur fluoride are $SF_x^+$ and F*. The above-mentioned sulfur fluoride has a larger S/F ratio (ratio of the number of S atoms to the number of F atoms in one molecule) than $SF_6$ which is conventionally applied to practical use, and can release free S in a plasma on dissociation due electric discharges.

Accordingly, if sulfur fluoride is added to COS, deposition of S can be reinforced, and the deposit amount, of carbonaceous polymer necessary for securing selectivity and anisotropy can be relatively reduced. Thus, particle pollution can be diminished significantly, and incident ion energy necessary for anisotropic processing can be reduced, thereby achieving high selectivity and low damage.

Further, if the above-mentioned $CH_xF_{4-x}$ and $C_mF_n$ are used as additional gases to COS in the just etching process, and if the above-mentioned sulfur fluoride is used as an additional gas to COS in the overetching process, an etching process superior in all the characteristics of high etchrate, high selectivity, low pollution and low damage can be realized.

BRIEF DESCRIPTION OF THE INVENTION

FIGS. 1a and 1b are schematic cross-sectional views showing an example of processes in which the present invention is applied to contact hole processing, in order of the processes. FIG. 1a shows a state in which a resist mask is formed on an $SiO_2$ interlayer insulation film. FIG. 1b shows a state in which a contact hole is formed.

FIG. 2 is a schematic cross-sectional view showing a state in which a contact hole is formed halfway, in another example of processes wherein the present invention is applied for contact hole processing.

DESCRIPTION OF THE PREFERRED EMBODIMENTS

Preferred embodiments of the present invention are explained.

EXAMPLE 1

Figure 1:
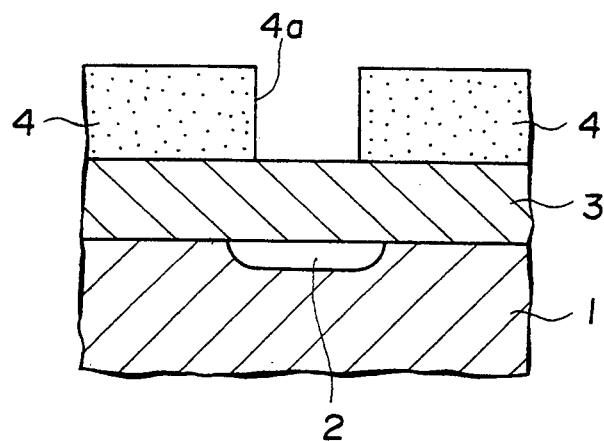
Figure 1:
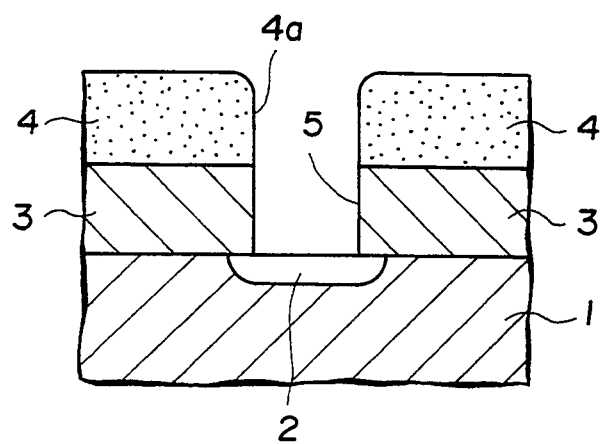

In the present example, the present invention was applied to contact hole processing, and an $SiO_2$ interlayer insulation film was etched, using a $COS/SF_6$ mixed gas. The process is explained with reference to FIG. 1.

A wafer used as a sample in this example is constituted by forming an $SiO_2$ interlayer insulation film 3 onto a single crystal Si substrate 1 on which an impurity diffused region 2 as underlying metallization is formed in advance, and forming a resist mask 4 patterned in a predetermined shape thereon. The resist mask 4 has an aperture 4a having a diameter of about 0.35 μm, as shown in FIG. 1a.

The wafer was set on a wafer setting electrode of a magnet ton reactive ion etching or RIE device. The wafer setting electrode has a cooling pipe therein. Coolants were supplied to the cooling pipe from a cooling facility, such as a chiller, connected outside of the device for circulating the coolants. Thus, it was possible to control the temperature of the wafer during the etching to not higher than room temperature. The $SiO_2$ interlayer insulation film 3 was etched, for example, under the following conditions:

| | |
|---|---|
| COS flow rate | 25 SCCM |
| $SF_6$ flow rate | 25 SCCM |
| gas pressure | 2.0 Pa |
| RF power density | 2.2 W/cm$^2$ (13.56 MHz) |
| magnetic field strength | $1.50 \times 10^{-2}$ T (= 150 G) |
| wafer temperature | $-30°$ C. (with an ethanol based coolant) |

Under the above-mentioned conditions, the etching proceeded with a mechanism that a radical reaction of F* dissociated from $SF_6$ and an extraction reaction of O atoms due to CO* dissociated from COS were assisted by incident energies of ions, such as $SF_x^+$, $CO^+$ and $COS^+$. Thus, a contact hole 5 having an anisotropic shape was formed. The etchrate was about 400 nm/min.

In this etching process, carbonyl derived from COS and C—O bonds were taken into decomposition products of the resist mask 4, thereby forming rigid carbonaceous polymer. The carbonaceous polymer and S on an exposed surface of the $SiO_2$ interlayer insulation film 3 were combusted by the reaction of O atoms sputtered out therefrom, and therefore were not deposited. The carbonaceous polymer and S were deposited on exposed surfaces of the resist mask 4 and the single crystal Si substrate, exhibiting surface protection effects. Under the above-mentioned conditions, since the wafer was cooled, the etchrate for etching the resist material and single crystal Si, which would be otherwise etched in a radical mode, was also lowered. For these reasons, high selection ratio to the resist of about 4 and high selection ratio to Si of about 25 were achieved, and no retreat of the resist mask 4 and no destruction of a shallow junction were observed even after the etching.

The carbonaceous polymer and S were deposited on sidewall surface of the pattern where vertical incidence of ions were unlikely to occur, and formed sidewall protection films, not shown. The anisotropic shape of the contact hole 5 was achieved by the contribution of the sidewall protection films.

In the present example, since deposition of S was expected, the deposit amount of carbonaceous polymer necessary for highly selective, anisotropic processing was reduced, thus improving the particle level compared with the conventional process. Accordingly, the frequency of maintenance for cleaning an etching chamber, and productivity was improved.

EXAMPLE 2

In the present example, the same contact hole processing was carried out, using a $COS/CHF_3$ mixed gas.

A wafer as shown in FIG. 1a was set on a magnetron RIE device, and an $SiO_2$ interlayer insulation film 3 was etched, for instance, under the following conditions:

| | |
|---|---|
| COS flow rate | 15 SCCM |
| $CHF_3$ flow rate | 35 SCCM |
| gas pressure | 2.0 Pa |
| RF power density | 2.0 W/cm$^2$ (13.56 MHz) |
| magnetic field strength | $1.50 \times 10^{-2}$ T (= 150 G) |
| wafer temperature | $-30°$ C. (with the ethanol based coolant) |

The etching mechanism in the present example is substantially as described in example 1. In the present example, since $CF_x^+$ was formed from $CHF_3$, the etchrate was increased to about 450 nm/min. In the present example, since carbonaceous polymer was formed in a gaseous phase due to decomposition products of $CHF_3$, it becomes unnecessary to sputter a resist using high incident ion energy. Accordingly, despite she slightly lower RF power density than in example 1, the selection ratio to the resist was about 5, and the selection ratio to Si was about 28. That is, higher selection ratios than in example 1 were achieved.

EXAMPLE 3

In the present example, the same contact hole processing was carried out by two-stage etching using a $COS/CHF_3$ mixed gas, wherein different mixture ratios of COS and $CHF_3$ were used between a just etching process and an overetching process. The process is explained with reference to FIG. 2 in addition to FIGS. 1a and 1b.

First, a wafer as shown in FIG. 1a was set on a magnetron RIE device, and an $SiO_2$ interlayer insulation film was etched by just etching, for example, under the following conditions:

| | |
|---|---|
| COS flow rate | 15 SCCM (content ratio 30%) |
| $CHF_3$ flow rate | 35 SCCM |
| gas pressure | 2.0 Pa |
| RF power density | 2.0 W/cm$^2$ (13.56 MHz) |
| magnetic field strength | $1.50 \times 10^{-2}$ T (= 150 G) |
| wafer temperature | $0°$ C. (with an ethanol based coolant) |

The just etching ended at the time when an underlying single crystal Si substrate ion a portion of the wafer, or more precisely an impurity diffused region 2, was exposed. However, on other portions of the wafer, a remaining section 3a of the $SiO_2$ interlayer insulation film 3 was left on the bottom of a contact hole 5.

Thus, the overetching for removing the remaining section 3a was carried out, for example, under the following condition:

| | |
|---|---|
| COS flow rate | 30 SCCM (content ratio 60%) |
| $CHF_3$ flow rate | 20 SCCM |
| gas pressure | 2.0 Pa |
| RF power density | 1.2 W/cm$^2$ (13.56 MHz) |
| magnetic field strength | $1.50 \times 10^{-2}$ T (= 150 G) |
| wafer temperature | 0° C. (with an ethanol based coolant) |

In the overetching process, the content ratio of COS in the etching gas was higher than in the just etching process, and the etching consisting mainly of an extraction reaction of O atoms from CO* proceeded. Thus, contribution of S to surface protection was increased, and F* was reduced. Also, the RF power density was lowered and incident ion energy was diminished. For these reasons, despite the wafer temperature closer to a room temperature range than in example 2, the selection ratios equal to those obtained in example 2 were attained. Ultimately, the contact hole 5 was formed in a highly anisotropic shape, as shown in FIG. 1b.

EXAMPLE 4

In the present example, the same contact hole processing was carried out, using a COS/c-$C_4F_8$ (octafluorocyclobutane) mixed gas.

A wafer as shown in FIG. 1a was set on a magnetron RIE device, and an $SiO_2$ interlayer insulation film 3 was etched, for example, under the following conditions:

| | |
|---|---|
| COS flow rate | 20 SCCM (content ratio 33%) |
| c-$C_4F_8$ flow rate | 40 SCCM |
| gas pressure | 2.0 Pa |
| RF power density | 2.0 W/cm$^2$ (13.56 MHz) |
| magnetic field strength | $1.50 \times 10^{-2}$ T (= 150 G) |
| wafer temperature | 0° C. (with an ethanol based coolant) |

Figure 2:
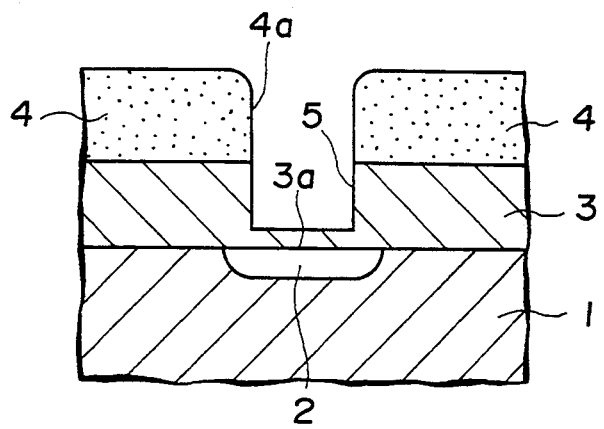

At the end of just etching, a remaining section 3a of the $SiO_2$ interlayer insulation film 3 was left in a portion of the wafer, as shown in FIG. 2.

Thus, overetching for removing the remaining section 3a was carried out, for example, under the following conditions::

| | |
|---|---|
| COS flow rate | 40 SCCM |
| c-$C_4F_8$ flow rate | 20 SCCM |
| gas pressure | 2.0 Pa |
| RF power density | 1.2 W/cm$^2$ (13.56 MHz) |
| magnetic field strength | $1.50 \times 10^{-2}$ T (= 150 G) |
| wafer temperature | 0° C. (with an ethanol based coolant) |

In the overetching process, etching proceeded, maintaining a high selection ratio to a single crystal Si substrate 1. Thus, with the two-stage etching, the selectivity equal to that obtained in example 4 was attained in the wafer temperature range higher than in example 4.

EXAMPLE 6

In the present example, the same contact hole processing was carried out, using a COS/$S_2F_2$ mixed gas.

A wafer as shown in FIG. 1a was set on a magnetron RIE device, and an $SiO_2$ interlayer insulation film 3 was etched, for example, under the following conditions:

| | |
|---|---|
| COS flow rate | 25 SCCM |
| $S_2F_2$ flow rate | 25 SCCM |
| gas pressure | 2.0 Pa |
| RF power density | 1.5 W/cm$^2$ (13.56 MHz) |
| magnetic field strength | $1.50 \times 10^{-2}$ T (= 150 G) |
| wafer temperature | 0° C. (with an ethanol based coolant) |

In this etching process, it was possible to use F* and $SF_x^+$ released from $S_2F_2$ as etchants, and also to deposit S efficiently released from $S_2F_2$ on the wafer for surface protection. In short, in addition to the effects of carbonaceous polymer derived from a resist mask 4, S supplied also from $S_2F_2$ was utilized for reinforcing surface protection effects. Therefore, despite the relatively low incident ion energy, highly selective, anisotropic etching was carried out.

Meanwhile, S deposited on the wafer was sublimated or combusted along with carbonaceous polymer when the resist mask 4 was removed by conventional $O_2$ plasma ashing after the etching. Thus, no particle pollution was left on the wafer.

EXAMPLE 7

In the present example, the same contact hole was carried out by two-stage etching, using a COS/$CHF_3$/$CF_4$ mixed gas in a just etching process and a COS/$S_2F_2$ mixed gas in an overetching process.

First, a wafer as shown in FIG. 1a was set on a magnetron RIE device, and an $SiO_2$ interlayer insulation film was etched by just etching, for instance, under the following conditions:

| | |
|---|---|
| COS flow rate | 15 SCCM |
| $CHF_3$ flow rate | 30 SCCM |
| $CF_4$ flow rate | 5 SCCM |
| gas pressure | 2.0 Pa |
| RF power density | 2.0 W/cm$^2$ (13.56 MHz) |
| magnetic field strength | $1.50 \times 10^{-2}$ T (= 150 G) |
| wafer temperature | 0° C. (cooling by water) |

In this just etching process, high-rate etching due to F*, $CF_x^+$ released from $CHF_3$, $CF_4$ proceeded.

Next, the overetching was carried out, for example, under the following conditions:

| | |
|---|---|
| COS flow rate | 15 SCCM |
| $S_2F_2$ flow rate | 35 SCCM |
| gas pressure | 2.0 Pa |
| RF power density | 1.0 W/cm$^2$ (13.56 MHz) |
| magnetic field strength | $1.50 \times 10^{-2}$ T (= 150 G) |
| wafer temperature | 0° C. (cooling by water) |

In this overetching process, the quantity supplied of carbonaceous polymer derived from a resist mask 4 was extremely small, for significantly lowering incident ion energy. Surface protection of the wafer was carried out mainly by S supplied from COS and $S_2F_2$. Accordingly, contact hole processing which causes no deterioration of the particle level even after a number of wafer processings, and exhibits high repeatability was carried out.

EXAMPLE 8

Also in the present example, two-stage etching was carried out. A COS/c-C$_4$F$_8$ mixed gas was used in a just etching process, and a COS/S$_2$F$_2$ mixed gas was used in an overetching process.

First, a wafer as shown in FIG. 1a was set on a magnetron RIE device, and an SiO$_2$ interlayer insulation film 3 was etched by just etching under the same conditions as in the just etching process of example 5.

Next, overetching was carried out, for example, under the following conditions:

| | |
|---|---|
| COS flow rate | 30 SCCM |
| S$_2$F$_2$ flow rate | 30 SCCM |
| gas pressure | 2.0 Pa |
| RF power density | 1.0 W/cm$^2$ (13.56 MHz) |
| magnetic field strength | $1.50 \times 10^{-2}$ T (= 150 G) |
| wafer temperature | 0° C. (cooling by water) |

In this overetching process, highly selective etching proceeded, with S instead of carbonaceous polymer used as a main component for surface protection substances.

The present invention has been explained on the basis of the above-described eight examples. However, the present invention is not limited to these examples.

For instance, even though other kinds of sulfur fluoride than S$_2$F$_2$ are used, basically the same effects can be obtained.

The silicon compound layer may be constituted by an SiO$_2$ silicon based material such as PSG, BSG, BPSG, AsSG, AsPSG and AsBSG, or SiN$_x$, other than the SiO$_2$ interlayer insulation film.

The constitution of the wafer used as an etching sample is not limited to the above-mentioned constitution. For instance, the underlying layer of the SiO$_2$ interlayer insulation film may be a polysilicon layer, a polycide film or a metallic material layer such as an Al-1% Si layer, other than the single crystal Si substrate.

A rare gas such as Ar may be suitably added to the etching gas for the purpose of obtaining sputtering effect, dilution effect and cooling effect.

It is a matter of course that the etching device and etching conditions may be suitably changed.

As is clear from the above description, with the present invention, the use of COS as an etching gas for etching the silicon compound layer makes it possible to carry out etching with high etchrate, high selectivity, low pollution and low damage, through reinforcement of carbonaceous polymer, the extraction reaction of O atoms and joint use of S deposition. Further, by adding a fluorocarbonaceous compound, high-order fluorocarbon and sulfur fluoride to the etching gas, or by changing gas composition at the time of overetching, it becomes possible to attain higher etchrate, higher selectivity, lower pollution and lower damage. Particularly, through full achievement of low pollution, yield and reliability of the semiconductor device are greatly improved, and the time for maintenance is reduced, thereby generating improvements in productivity and economy.

The present invention is extremely useful for production of the semiconductor device which is designed on the basis of minute design rules, and requires large-scale integration, high performance and high reliability.

What is claimed is:

1. A dry etching method for etching a silicon compound layer of insulating material, said method comprising the steps of providing a patterned masking material on the silicon compound layer to expose an area of the silicon compound layer; and plasma etching the exposed area of the silicon compound layer with an etching gas containing carbonyl sulfide.

2. The dry etching method as claimed in claim 1, wherein said etching gas contains at least one kind of sulfur fluoride selected from the group consisting of S$_2$F$_2$, SF$_2$, SF$_4$ and S$_2$F$_{10}$, while supplying depositable S to etching reaction system.

3. The dry etching method as claimed in claim 1, wherein said silicon compound layer is selected from the group consisting of a silicon oxide based material layer and a silicon nitride based material layer.

4. A dry etching method according to claim 1, wherein the etching gas also contains a fluorocarbonaceous compound expressed by a general formula CH$_x$F$_{4-x}$, where x represents integers from 0 to 3.

5. The dry etching method as claimed in claim 4, wherein said etching gas contains at least one kind of sulfur fluoride selected from the group consisting of S$_2$F$_2$, SF$_2$, SF$_4$ and S$_2$F$_{10}$, while supplying depositable S to etching reaction system.

6. The dry etching method as claimed in claim 4, wherein said silicon compound layer is selected from the group consisting of a silicon oxide based material layer and a silicon nitrite based material layer.

7. A dry etching method of selectively etching a silicon compound layer of insulating material comprising a first step of plasma etching the silicon compound layer to a depth less than a thickness of the silicon compound layer with a first etching gas containing carbonyl sulfide and a fluorocarbonaceous compound in a first ratio, said fluorocarbonaceous compound being expressed by a general formula CH$_x$F$_{4-x}$, where x represents integers 0 to 3; and a second step of plasma etching the silicon compound layer remaining after the first etching step with a second etching gas having a higher content ratio of the carbonyl sulfide to the fluorocarbonaceous compound than the first ratio in the first etching step.

8. The dry etching method as claimed in claim 7, wherein said etching gas contains at least one kind of sulfur fluoride selected from the group consisting of S$_2$F$_2$, SF$_2$, SF$_4$ and S$_2$F$_{10}$, while supplying depositable S to etching reaction system.

9. The dry etching method as claimed in claim 7, wherein said silicon compound layer is selected from the group consisting of a silicon oxide based material layer and a silicon nitride based material layer.

10. A dry etching method comprising plasma etching a silicon compound layer, with an etching gas containing carbonyl sulfide and high-order fluorocarbon expressed by a general formula C$_m$F$_n$, where m, n are natural numbers satisfying $m \geq 2$, $n \leq 2m+2$.

11. The dry etching method as claimed in claim 10, wherein said etching gas contains at least one kind of sulfur fluoride selected from the group consisting of S$_2$F$_2$, SF$_2$, SF$_4$ and S$_2$F$_{10}$, while supplying depositable S to etching reaction system.

12. The dry etching method as claimed in claim 10, wherein said high-order fluorocarbon is c-C$_4$F$_8$.

13. The dry etching method as claimed in claim 10, wherein said silicon compound layer is selected from the group consisting of a silicon oxide based material layer and a silicon nitride based material layer.

14. A dry etching method of selectively etching a silicon compound layer of insulating material, comprising a first step of plasma etching the silicon compound layer to a depth less than a thickness of the silicon compound layer with a first etching gas containing carbonyl sulfide and a high-order fluorocarbon in a first ratio, said high-order fluorocarbon being expressed by a general formal $C_mF_n$, where m, n are natural numbers satisfying $m \geq 2$, $n \leq 2m+2$; and a second step of plasma etching the silicon compound layer remaining after the first etching step with a second etching gas having a higher content ratio of the carbonyl sulfide to the high-order fluorocarbon than the first ratio of the first etching step.

15. The dry etching method as claimed in claim 14, wherein said etching gas contains at least one kind of sulfur fluoride selected from the group consisting of $S_2F_2$, $SF_2$, $SF_4$ and $S_2F_{10}$, while supplying depositable S to etching reaction system.

16. The dry etching method as claimed in claim 14, wherein said high-order fluorocarbon is $c$-$C_4F_8$.

17. The dry etching method as claimed in claim 14, wherein said silicon compound layer is selected from a group consisting of a silicon oxide based material layer and a silicon nitride based material layer.

18. A dry etching method of selectively etching a silicon compound layer of insulating material, comprising a first step of plasma etching the silicon compound layer to a depth less than a thickness of the silicon compound layer with a first etching gas containing carbonyl sulfide and at least one gas selected from the group consisting of a fluorocarbonaceous compound expressed by a general formula $CH_xF_{4-x}$, where x represents integers from 0 to 3, and high-order fluorocarbon expressed by a general formula $C_mF_n$, where m, n are integers satisfying $n \geq 2$, $m \leq 2n+2$; and a second step of plasma etching the silicon compound layer remaining after the first etching step with a second etching gas containing carbonyl sulfide and at least one kind of sulfur fluoride selected from the group consisting of $S_2F_2$, $SF_2$, $SF_4$ and $S_2F_{10}$.

19. The dry etching method as claimed in claim 18, wherein said high-order fluorocarbon is $c$-$C_4F_8$.

20. The dry etching method as claimed in claim 18, wherein said silicon compound layer is selected from the group consisting of a silicon oxide based material layer and a silicon nitride based material layer.

* * * * *